(12) United States Patent
Mousavian et al.

(10) Patent No.: US 12,176,679 B2
(45) Date of Patent: Dec. 24, 2024

(54) FAST PULSE, HIGH CURRENT LASER DRIVERS

(71) Applicant: Infineon Technologies Canada Inc., Ottawa (CA)

(72) Inventors: Hossein Mousavian, Kanata (CA); Larry Spaziani, Chelmsford, MA (US)

(73) Assignee: Infineon Technologies Canada Inc., Ottawa (CA)

( * ) Notice: Subject to any disclaimer, the term of this patent is extended or adjusted under 35 U.S.C. 154(b) by 917 days.

(21) Appl. No.: 17/047,509

(22) PCT Filed: Feb. 27, 2020

(86) PCT No.: PCT/CA2020/050257
§ 371 (c)(1),
(2) Date: Oct. 14, 2020

(87) PCT Pub. No.: WO2020/176971
PCT Pub. Date: Sep. 10, 2020

(65) Prior Publication Data
US 2021/0111533 A1 Apr. 15, 2021

Related U.S. Application Data

(60) Provisional application No. 62/812,484, filed on Mar. 1, 2019.

(51) Int. Cl.
*H01S 5/042* (2006.01)
*G01S 7/484* (2006.01)
(Continued)

(52) U.S. Cl.
CPC ............ *H01S 5/0428* (2013.01); *G01S 7/484* (2013.01); *G01S 17/10* (2013.01); *H01S 5/4025* (2013.01); *H03K 3/012* (2013.01)

(58) Field of Classification Search
CPC ...................................................... H01S 5/0428
See application file for complete search history.

(56) References Cited

U.S. PATENT DOCUMENTS 6,697,402 B2    2/2004    Crawford
7,262,584 B2    8/2007    Crawford et al.
(Continued)

FOREIGN PATENT DOCUMENTS

CN    101567519 A    10/2009
CN    102610998 A    7/2012
(Continued)

OTHER PUBLICATIONS

International Search Report issued on International Patent Application No. PCT/CA2020/050257 mailed May 12, 2020; 4 pages.
(Continued)

*Primary Examiner* — Minsun O Harvey
*Assistant Examiner* — Stephen Sutton Kotter
(74) *Attorney, Agent, or Firm* — WORKMAN NYDEGGER

(57) ABSTRACT

Pulsed laser drivers are disclosed comprising Gallium Nitride (GaN) power transistors for driving diode laser systems requiring high current and fast pulses, such as laser drivers for LIDAR (Light Detection and Ranging) systems. Drivers are capable of delivering pulses with peak current ≥100 A, e.g. 170 A to provide high peak power, fast pulses with nanosecond rise times and nanosecond pulse duration, for driving multi-channel laser diode arrays with 40 A per channel for 120 W output per channel for a combined peak output of 480 W. For lower duty cycle, example driver circuits are disclosed comprising a high current power transistor for direct drive with drive assist. For higher duty cycle, example resonant driver circuits are disclosed comprising two high current power transistors. Implementation (Continued)

of resonant driver circuits with GaN technology provides fast charging for short pulse operation at higher repetition rates or for pulse code modulation.

15 Claims, 7 Drawing Sheets

(51) Int. Cl.
  *G01S 17/10* (2020.01)
  *H01S 5/40* (2006.01)
  *H03K 3/012* (2006.01)

(56) References Cited

U.S. PATENT DOCUMENTS

| | | | |
|---|---|---|---|
| 7,545,839 | B2 | 6/2009 | Giorgi et al. |
| 8,184,670 | B2 | 5/2012 | Crawford et al. |
| 9,368,936 | B1 * | 6/2016 | Lenius .................... G01S 17/10 |
| 9,847,736 | B2 * | 12/2017 | Grootjans ................ G01C 3/08 |
| 10,141,716 | B1 | 11/2018 | Lenius et al. |
| 10,158,211 | B2 | 12/2018 | Barnes et al. |
| 2017/0005465 | A1 | 1/2017 | Wyland et al. |
| 2017/0085057 | A1 * | 3/2017 | Barnes ................. H01S 5/0428 |
| 2018/0109074 | A1 | 4/2018 | Gassend et al. |
| 2018/0261975 | A1 | 9/2018 | Pavlov et al. |
| 2018/0284227 | A1 | 10/2018 | Hall et al. |
| 2018/0323576 | A1 | 11/2018 | Crawford et al. |

FOREIGN PATENT DOCUMENTS

| | | |
|---|---|---|
| DE | 102006036167 A1 | 2/2008 |
| WO | 2018183843 A1 | 10/2018 |

OTHER PUBLICATIONS

Osram (www.osram-os.com), Datasheet SPL S4L90A_3 A01 "SMT Laser, 4 Channel SMT Laser in QFN package" v. Sep. 27, 2019; 21 pages.
Ann Russell et al., "Lasers for Lidar: Monolithic multichannel laser moves automotive lidar toward practical use", Laser Focus World Jul. 31, 2019; 8 pages.
Osram Licht AG, "LiDAR Teach-In" Jun. 20, 2018 (https://www.osram-group.com/~/media/Files/O/Osram/Investor%20Relations/Publications_other/2018/presentation-investor-analyst-call.pdf); pp. 1-22.
P. Pickering, "GaN Devices Power the Next Generation of LiDAR Systems", Electronic Design, Jun. 19, 2018 (https://www.electronicdesign.com/print/79023); 11 pages.
J. Glaser, "Kilowatt Laser Driver with 120A, sub-10 nanosecond pulses in <3cm2 using a GaN FET", PCIM Asia 2018, Jun. 26-28, 2018; 20 pages.
S. Vainshtein et al., "Miniature High-Power Nanosecond Laser Diode Transmitters Using the Simplest Possible Avalanche Drivers" IEEE Transactions on Power Electronics vol. 34, No. 4, Apr. 2019; pp. 3689-3699.
CN2020800057342 Office Action dated Feb. 29, 2024.

\* cited by examiner

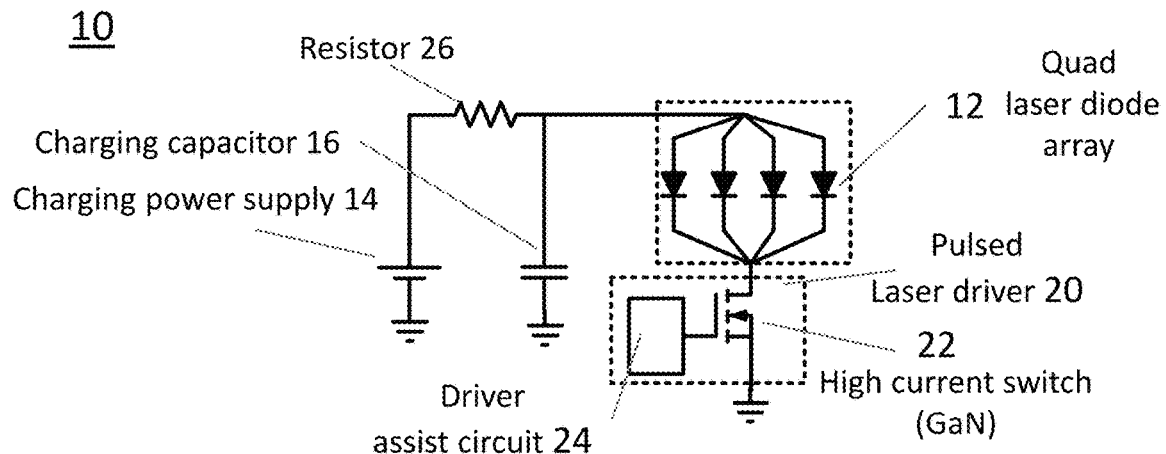
Direct drive with drive-assist
Fig. 2
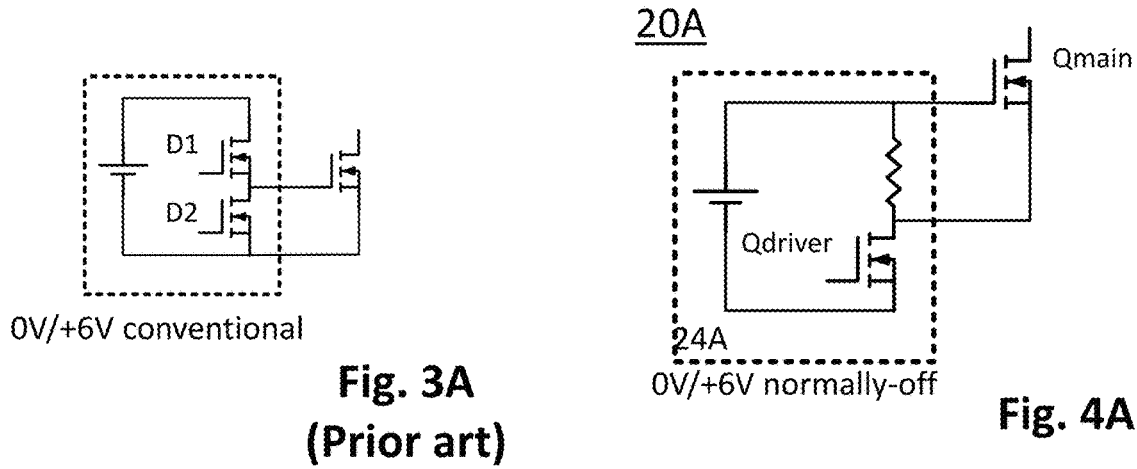
Fig. 3A
(Prior art)
Fig. 3B
(Prior art)
Fig. 4A
Fig. 4B

FAST PULSE, HIGH CURRENT LASER DRIVERS

CROSS-REFERENCE TO RELATED APPLICATION(S)

This application is a national phase application of International Application No. PCT/CA2020/050257 filed Feb. 27, 2020 and claims priority from U.S. provisional patent application No. 62/281,484, filed Mar. 1, 2019, entitled "FAST PULSE, HIGH CURRENT LASER DRIVERS", which are incorporated herein by reference, in their entirety.

TECHNICAL FIELD

The present invention relates to pulsed laser drivers and particularly to driver circuitry comprising Gallium Nitride (GaN) power transistors for driving diode laser systems requiring high current and fast pulses, such as laser drivers for LIDAR (Light Detection and Ranging) systems.

BACKGROUND ART

LIDAR systems employ pulses of light to measure distance to an object based on time of flight (ToF). Distance is computed based on the time elapsed between emission of a light pulse from a light source (emitter), such as a laser diode, and detection of a reflected pulse of light by a detector which is mounted near the emitter. Some systems use a single light emitter and detector with rotating mirrors to scan across a plane (two-dimensional/2D system). Three-dimensional (3D) LIDAR systems scan in both horizontal and vertical planes. Other 3D systems use arrays of multiple light emitters and detectors.

For background information regarding LIDAR for automotive applications, such as autonomous driving, reference is made to a presentation entitled "LIDAR Teach-In" dated Jun. 20, 2018 by OSRAM Licht AG.

For long range applications, such as collision avoidance of moving vehicles, for accurate identification of longer range stationary and moving objects, LIDAR time-of-flight systems require high power, fast light pulses, e.g. nanosecond pulse widths at peak powers in excess of 100 W.

Recently, it has been is recognised that wide-bandgap semiconductor devices based on Silicon Carbide (SiC) technology and Gallium Nitride (GaN) technology offer advantages over silicon power MOSFETs for fast high current switches for this type of laser driver circuitry. For example, GaN power transistors are now commercially available that offer very fast, nanosecond timescale switching, for currents in a range of tens to hundreds of amps, for operation at voltages in the 100V to 650V range.

By way of example, US2018/0323576A1 published Nov. 8, 2018, by Crawford et al. (Analog Modules Inc.) entitled "Pulsed laser diode drivers and methods" discloses a current driver for very short pulses at high currents to be generated for high power laser diodes, which uses a current control device comprising a GaN FET or SiC FET in series with a laser diode; US2018/0284227A1 published Oct. 4, 2018, by Hall et al. (Velodyne Lidar Inc.) entitled "Integrated LIDAR Illumination Power Control" discloses methods and systems comprising a GaN based illumination driver integrated circuit; US2018/0261975A1 published 13 Sep. 2018, by Pavlov et al. (SensL Technologies Inc.) entitled "Laser Driver" discloses a laser driver comprising a resonant circuit having an inductor and DC blocking capacitor, and using a GaN transistor which is driven by a MOSFET gate driver.

While these references provide some examples of the advantages of GaN power switching devices for fast pulse laser drivers, there is a need for further improvements in pulsed laser driver circuitry for laser diodes that can deliver higher currents and faster pulse widths. For example, for LIDAR systems, there is now a need for diode lasers and diode laser arrays requiring very high current (>100 A) and short pulses with nanosecond rise time and pulse widths (pulse durations) with a nanosecond FWHM (full-width-half-maximum). Conventional Si MOSFET based laser driver circuits cannot deliver the required performance, e.g. due to one or more of: slow transistors, low current drivers, high inductance layouts, and poor topology choices.

To take full advantage of the capabilities of GaN power transistors as fast, high current switching devices for laser drivers, improved pulsed laser driver circuitry is required to overcome one or more of these limitations.

Thus, there is a need for development of improved or alternative driver solutions for driving pulsed laser diodes and pulsed laser diode arrays, for applications such as LIDAR.

SUMMARY OF INVENTION

The present invention seeks to provide pulsed laser drivers for driving diode laser systems requiring fast, high current switching, such as laser drivers for LIDAR systems, which mitigate or circumvent one or more limitations of known solutions, or at least provides an alternative.

For lower duty cycle applications, a pulsed laser driver is provided comprising a current switch for direct drive with drive assist, wherein the current switch comprises a fast high current GaN power transistor Qmain which is driven by gate drive assist circuitry comprising an arrangement of a single low current transistor Qdriver and a resistor. A fast-pulse gate drive signal turns-on/-off Qdriver to provide rapid turn-on/-off of Qmain to fire the laser, generating a laser pulse with nanosecond rise time and pulse duration, with high peak power.

One aspect of the invention provides a pulsed laser driver, for direct drive of a laser diode or laser diode array, comprising:
a current switching device comprising an e-mode high current GaN power transistor (Qmain) having a source, drain and gate;
driver assist circuitry comprising a low current e-mode transistor (Qdriver) and a driver resistor R1,
a drain of Qdriver being connected through R1 to a first power terminal V+ and the source of Qdriver being connected to a second power terminal $V_0$, and the driver circuitry have a gate drive input connected to a gate of Qdriver for receiving a gate drive signal;
the high side of R1 being connected to the gate of Qmain and the low side of R1 being connected to the source of Qmain.

Another aspect of the invention provides pulsed laser driver, for direct drive of a laser diode or laser diode array, comprising:
a current switching device comprising an e-mode high current GaN power transistor (Qmain) having a source, drain and gate;
driver assist circuitry comprising a low current d-mode transistor (Qdriver) and a driver resistor R1,
a drain of Qdriver being connected through R1 to a first power terminal V+ and the source of Qdriver being connected to a second power terminal V−, and the driver circuitry have a gate drive input connected to a gate of Qdriver for receiving a gate drive signal;

the low-side of R1 being connected to the gate of Qmain and the source of Qmain being coupled to a third power terminal $V_0$.

The laser drivers may comprise discrete components, or be in a module integrating the components, e.g. as one or more functional blocks.

For example, for the pulsed laser driver for direct drive with drive assist ("direct drive laser driver"), where Qdriver is a GaN transistor it may be integrated with Qmain. Where Qdriver is a Si MOSFET or SiC transistor it may be co-packaged with Qmain.

Other aspects of the invention provides modules comprising the direct drive laser driver connected in series with a laser diode or laser diode array D3 for direct drive of D3, LIDAR devices comprising the direct drive laser circuitry, and LIDAR devices comprising a module integrating the direct drive laser driver circuitry and a diode laser array.

For example, in exemplary embodiments, the laser drivers are configured for generating current pulses with a nanosecond rise time and pulse duration and a peak current ≥100V, e.g. a peak current of 170 A for driving a multi-channel laser diode array, such as a quad laser array, to be driven with 40 A per channel to generate a peak output from the lasers of 120 W peak power per channel, or 480 W peak power in total. The pulsed laser drivers for direct drive with drive assist are suitable for low duty cycle applications.

For higher duty cycle applications, faster charge/recharge is needed and a pulsed laser driver comprising a resonant drive is disclosed, which comprises two fast, high current GaN power transistors Q1 and Q2, i.e. as high-side and low-side current switches in a resonance circuit loop. Q1 and Q2 are turned on to initiate operation for charge or recharge, to build current, and when the resonance current peaks at a desired value, fast turn-off of Q2 provides a fast, high current pulse to trigger the laser pulse. The resonant driver provides for fast high current switching with faster (re) charging for higher repetition rates, e.g. for longer range LIDAR definition, and to enable applications such as LIDAR with pulse code modulation.

Thus, yet another aspect of the invention provides a pulsed laser driver, for resonant drive of a laser diode or laser diode array D3, comprising:
first and second switching devices comprising high current GaN power transistors Q1 and Q2, each having a source, drain and gate;
Q1 and Q2 being part of a resonant driver circuit comprising a resonance inductance L1 and a resonance DC capacitor C1, wherein the drain of Q1 is connected to a first power terminal V+, the source of Q1 is connected through L1 to the drain of Q2, the source of Q2 is connected to a second power terminal $V_0$, and C1 is connected between first and second power terminals V+, $V_0$ to form a resonant loop,
a first terminal for connection to an anode A of the laser diode or diode array D3 and a second terminal for connection to a cathode K of the laser diode or diode array D3;
the first terminal being connected through a DC blocking diode D1 to a node between the low-side of L1 and the drain of Q2 and the second terminal being connected to the source of Q2 to form a laser power loop, and the laser power loop comprising a series resonance capacitor C3.

Since Q2 is turned off only to trigger the laser pulse, Q2 may be a normally-on GaN transistor. After triggering the laser pulse Q1 may be left on for a period which allows retrieval or recovery of energy from L1 to C1. L1 acts as a current source during recovery. The DC blocking diode D1, and a diode D2 provided antiparallel to the laser diode/diode array D3 limits the reverse voltage for protection of D3. D1 helps retrieving energy in the system (C3 energy). The circuit may comprise an energy recovery circuit connecting C3 to C1.

Pulsed laser drivers for resonance drive may comprise discrete components, or be in a module integrating the components, e.g. as one or more functional blocks.

Other aspects of the invention provide modules comprising the pulsed laser driver for resonance drive integrated with a laser diode or laser diode array D3 for direct drive of D3, LIDAR devices comprising the laser driver circuitry for resonance drive, and LIDAR devices comprising a module integrating the laser driver circuitry for resonance drive with a diode laser/diode laser array.

For example, in exemplary embodiments, the laser drivers are configured for generating current pulses with a nanosecond rise time and pulse duration and a peak current of 170 A. For example, in a module comprising a multi-channel laser array, e.g. a quad diode laser array, the driver is configured for generating current pulses with a nanosecond rise time and pulse duration with a peak current of 170 A, for driving each channel at 40 A to provide an output of 120 W per channel, for a peak power of 480 W.

Also provided is a method of operating the pulsed laser driver for resonant drive, as described herein. The method may comprise generating a single laser pulse per cycle. The method may comprise generating a plurality of pulses per cycle, e.g. to enable pulse coding.

Thus, laser drivers of example embodiments are disclosed that take advantage of the characteristics of GaN power transistors for use as fast, high current switches for driving laser diodes and laser diode arrays requiring currents of >100V, for generating laser light pulses, e.g. with nanosecond rise time and with a FWHM in a range of sub-nanosecond to tens of nanoseconds. In example embodiments, pulsed laser drivers comprising direct drive with drive assist, and pulsed laser drivers comprising resonant drive circuits may be implemented using GaN power transistors. In other embodiments the pulsed laser drivers may be implemented using SiC power transistors, or Si power MOSFETs, or a combination of GaN power transistors and SiC or Si power MOSFETs.

Thus, embodiments of the invention provide laser driver circuitry for driving high current, fast pulse laser diodes and diode arrays, for fast pulse, high power laser systems such as LIDAR systems.

BRIEF DESCRIPTION OF THE DRAWINGS

FIG. 2 shows a circuit schematic comprising a quad diode laser array, and a laser driver comprising a GaN transistor switch and driver circuitry for "Direct Drive with Drive Assist";

FIG. 3A (Prior Art) shows a circuit schematic of a laser driver comprising a GaN transistor switch with a first conventional driver circuit;

FIG. 3B (Prior Art) shows a circuit schematic of a laser driver comprising a GaN transistor switch with a second conventional driver circuit;

FIG. 4A shows a circuit schematic of a laser driver comprising a GaN transistor switch and a driver circuit of a first embodiment;

FIG. 4B shows a circuit schematic of a laser driver comprising a GaN transistor switch and a driver circuit of a second embodiment;

The foregoing and other objects, features, aspects and advantages of the present invention will become more apparent from the following detailed description, taken in conjunction with the accompanying drawings, of preferred embodiments of the invention, which description is by way of example only.

DETAILED DESCRIPTION OF EMBODIMENTS

Figure 1:
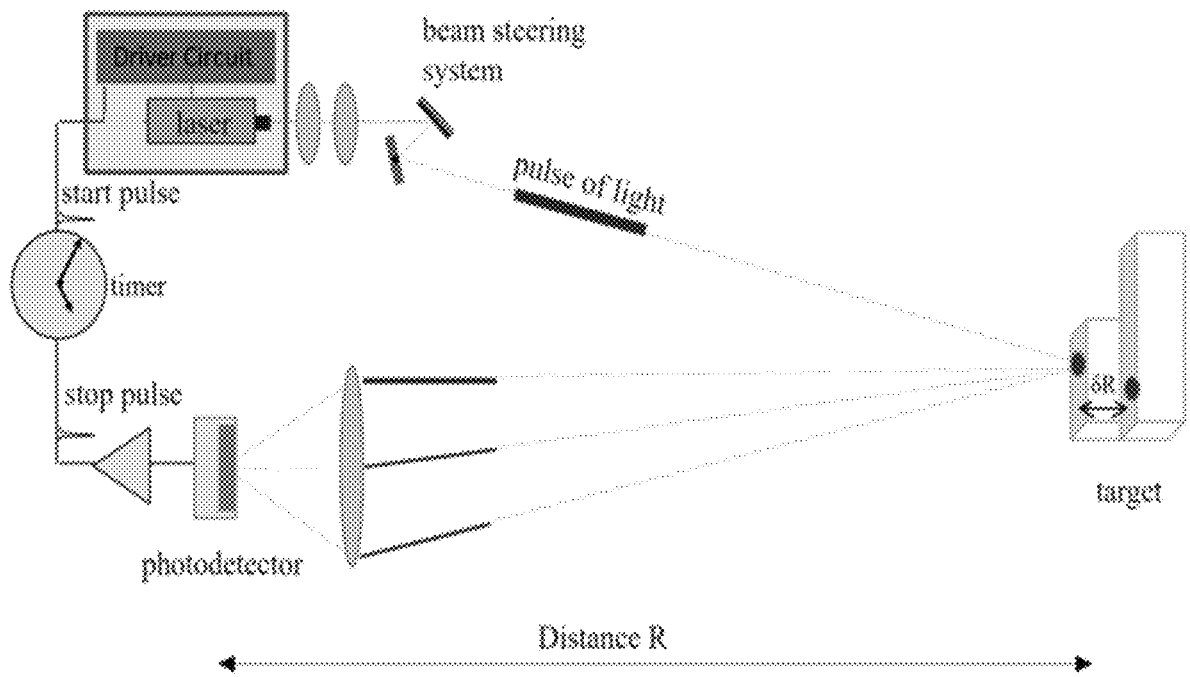
FIG. 1 shows a simplified schematic of a LIDAR system.

FIG. 1 shows a simplified schematic diagram of a LIDAR system 1. An explanation of the components and principle of operation of a LIDAR system of this type can be found, for example, in the above-mentioned patent and non-patent references.

In summary, the range R is determined from the time of flight Δt, the speed of light c as: R=c·Δt/2 and δR=c/2B.

Higher power lasers have longer range, and shorter laser pulse widths provide better resolution. Better definition is achieved for higher frequency pulses, i.e. for higher pulse repetition rate, which may be in the kHz to MHz range.

LIDAR systems for automotive applications, such as collision avoidance systems are typically based on diode lasers operating at <1000 nm, e.g. 905 nm. Laser diodes operating at >1000 nm, e.g. 1555 nm, are under development and may be preferred for eye safety, but at present these are not economically feasible.

Pulsed Laser Driver Circuit for Direct Drive with Drive Assist

A circuit schematic for a system 10 comprising a quad diode laser array 12 and a laser driver circuit 20 of a first embodiment is shown in FIG. 1. The laser diode array 12 comprises four laser diodes connected in parallel, and the laser diode array is connected in series with a current switching device comprising a fast, high current GaN power transistor 22, which is controlled by the driver assist circuit 24. Power to the laser array is provided by a high current power supply 14 and charging capacitor 16. For each pulse, while the GaN power transistor 22 is off, the charging capacitor 16 is charged from the high current power supply 14 through resistor 26. For example, the charging voltage may be 200V, or any suitable value, typically in a range from 10V to 400V. To fire the laser array, a pulse control signal is provided to an input of the driver assist circuit 24 to turn-on/off the high current GaN transistor 22 for a time period that controls the pulse duration, so that current flows through the laser diode array to generate a light pulse.

By way of example, for a long range LIDAR application, an array of four laser diodes is used, and optical requirements include, e.g.:
a peak optical power of 480 W for long range, i.e. 120 W per channel;
a current of 160 A is required for driving the quad laser array, i.e. 40 A per laser diode;
a 1 ns pulse duration/response for object discrimination, thermal performance and eye safety;
a duty cycle/pulse repetition rate with <1,000 ns between laser firing.

Additionally, pulse coding using a series of multiple pulses in each 1000 nsec cycle may be required to create a unique signature for each piece of LIDAR equipment.

To meet these optical requirements, the electrical requirements for driving the laser diode array includes a main GaN transistor switch 22 that is capable of fast switching (nanosecond time scale) of currents of >100 A, and low inductance circuitry is required to achieve ns switching. High frequency operation, i.e. with a high pulse repetition rate, also requires fast transistors and high CTMI transistor drivers with large current. Pulse coding requires fast recharge. GaN power transistors provide for higher current density, thus larger current and lower power loss than silicon power MOSFETs. Accordingly, replacing a Si MOSFET, with a GaN FET current switch 22 offers significant advantages for high current, fast switching. To benefit from the advantages of GaN FETS for fast switching, it is also necessary to have fast driver circuitry.

FIGS. 3A and 3B show first and second conventional arrangements of Si MOSFET driver circuits comprising a pair (i.e. high-side and low-side) of driver Si MOSFETS D1 and D2 to drive the main transistor switch. FIG. 3A shows an example using a single power supply, e.g. for 0 to 6V operation. FIG. 3B shows an example using a dual power supply, e.g. for −6V to +6V operation. Each circuit requires first and second gate drive signals for D1 and D2, which creates timing issues for fast switching. Driver circuits of this type with two drive assist transistors are commonly used for current switching applications requiring only 6 A or 7 A.

FIGS. 4A and 4B shows driver circuitry 20A and 20B of first and second embodiments wherein the driver assist circuitry 24A and 24B comprises a single fast switching, low current drive assist transistor $Q_{driver}$ for controlling turn-on and turn-off of the main GaN FET power switch 22 ($Q_{main}$). FIG. 4A shows an embodiment using a single power supply V+, e.g. for 0 to 6V operation. FIG. 4B shows an embodiment using a dual power supply V+, V−, e.g. for −6V to +6V operation. In these embodiments, the conventional second drive assist transistor is replaced with a resistor, to provide a simpler, fast switching driver. Since there is only one drive assist transistor Qdriver, the circuit requires only one gate drive signal, thereby removing issues of timing of gate drive signals to driver transistors D1 and D2 of the conventional driver circuits of FIGS. 3A and 3B.

Figure 5:
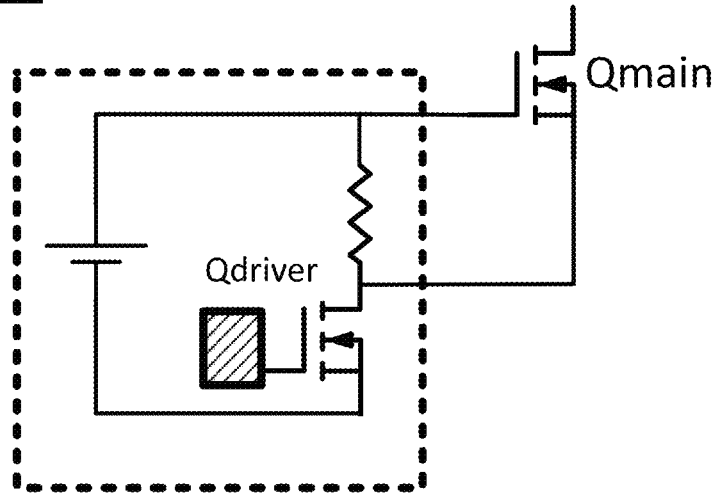
FIG. 5 shows a circuit schematic with more details of implementation of the GaN transistor switch and driver circuit of the first embodiment, suitable for low duty cycle.

Referring to FIG. 5, which shows more detail of implementation of the driver circuit 20A of FIG. 4A, the main current switch Qmain is a fast, high current GaN FET, such as Gan Systems Inc. GS66516T. The drive assist transistor Qdriver is a fast, low current transistor which may be a GaN FET, or a suitable SiC transistor or Si MOSFET with antiparallel diode. This circuit includes driver resistor Rdriver (R1) and capacitor C1. This circuit is suitable for generating short pulses with a small duty cycle. For small duty cycle, $Q_{driver}$ is off most of the time. When, $Q_{driver}$ is off, and the gate source voltage Vgs of Qmain is 0, the capacitor C1 is charged from the supply V+. When Qdriver is turned on, i.e. by receiving a control signal pulse to its gate, the voltage on the capacitor C1, i.e. V+, is applied across resistor Rdriver to Vgs to turn-on Qmain. This predriver circuit has only one transistor Qdriver to provide a simple, fast pulse driver with reduced timing issues, suitable for applications having a low, short duty cycle.

Figure 6:
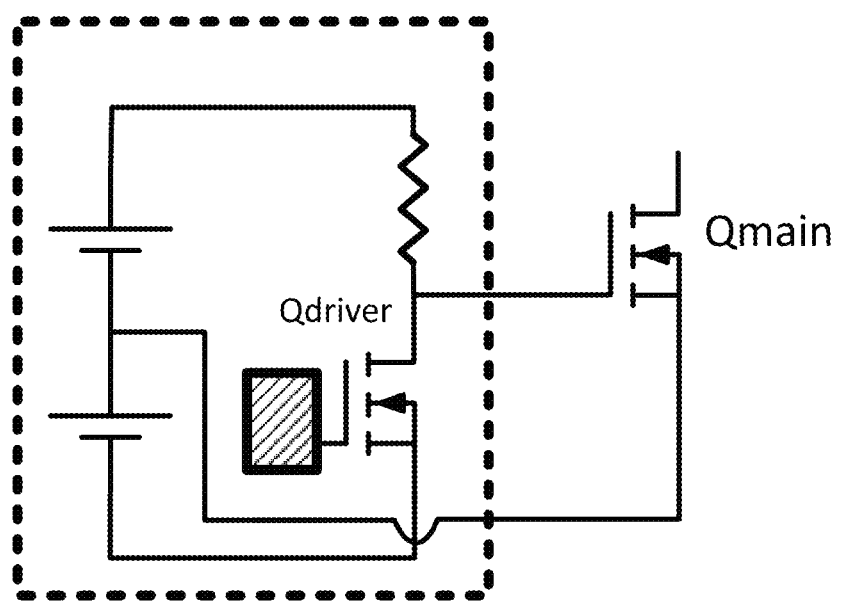
FIG. 6 shows a circuit schematic with more details of implementation of the GaN transistor switch and driver circuit of the second embodiment, suitable for higher duty cycle.

Referring to FIG. 6, which shows more detail of implementation of the driver circuit 20B of FIG. 4B, the main current switch Qmain is a fast, high current GaN FET, such as GSGS66516T. The drive assist transistor Qdriver is a fast, low current transistor such as GS66504B. There is a dual power supply, e.g. for −6V to +6V operation. Qdriver is normally-on. During operation, when Qdriver is on, the gate-source voltage Vgs of Qmain is −6V, i.e. V− is applied to the gate of Qmain and Qmain is held firmly off. When Qdriver receives a control pulse to its gate and is turned off, Vgs goes to +6V to turn on Qmain, i.e. V+ is applied to the gate of Qmain to rapidly turn-on Qmain to fire the laser array. This predriver circuit has only one transistor Qdriver to provide a simple, fast pulse driver with reduced timing issues.

Both the driver circuits of FIGS. 5 and 6 use a fast, low current drive assist transistor Qdriver to turn-on and turn-off the main transistor to fire the laser array. Circuit 24A turns Qmain ON very fast. Circuit 24B turns Qmain OFF very fast. These circuits are capable of providing fast pulses for nanosecond turn-on and turn-off of Qmain to generate short laser pulses with nanosecond rise time and nanosecond FWHM, for cycle times of 1000 ns, i.e. kHZ repetition rates, i.e. a short pulse with low duty cycle. Since power is dissipated in the driver circuitry during in the on-state of Qmain, this driver circuit arrangement is suited to low duty cycle operation in which the laser is off for most of the cycle.

Pulsed Laser Driver Circuit with Resonant Drive

Figure 7:
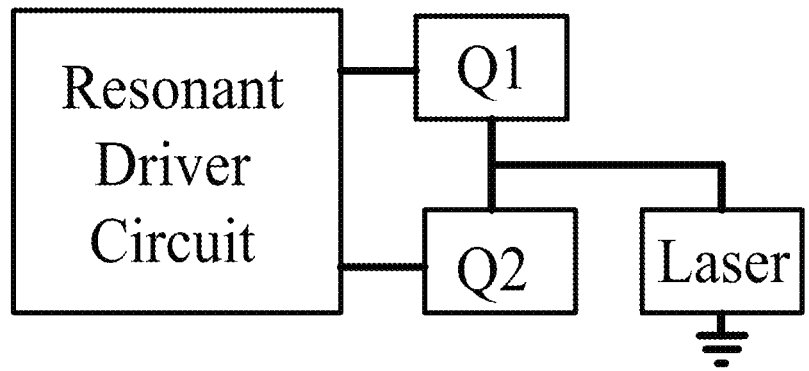
FIG. 7 shows a circuit schematic of a laser driver comprising a resonant driver circuit of an embodiment comprising first and second (high-side and low-side) GaN transistor switches.
Figure 8A:
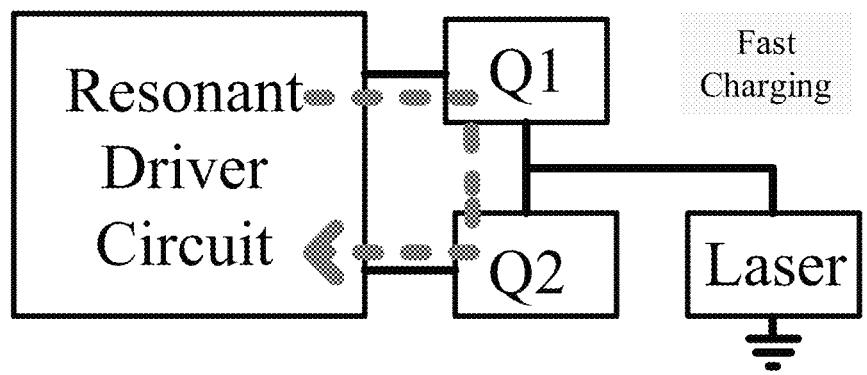
FIGS. 8A and 8B show circuit schematics and FIG. 8C shows an example of a plot of the resonant circuit current and laser current as a function of time, for one pulse.
Figure 8B:
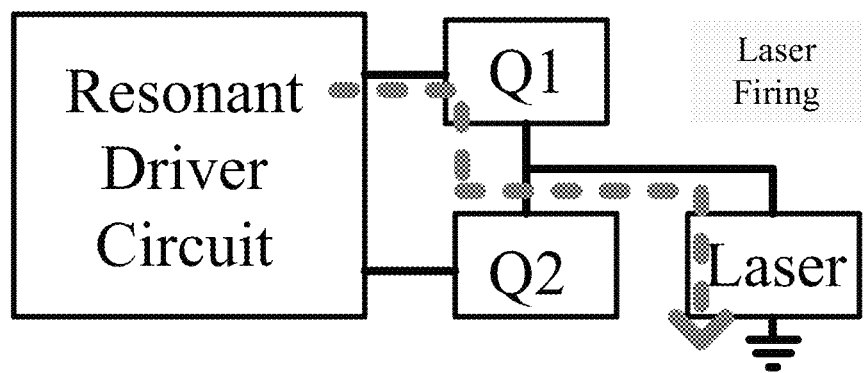
Figure 8C:
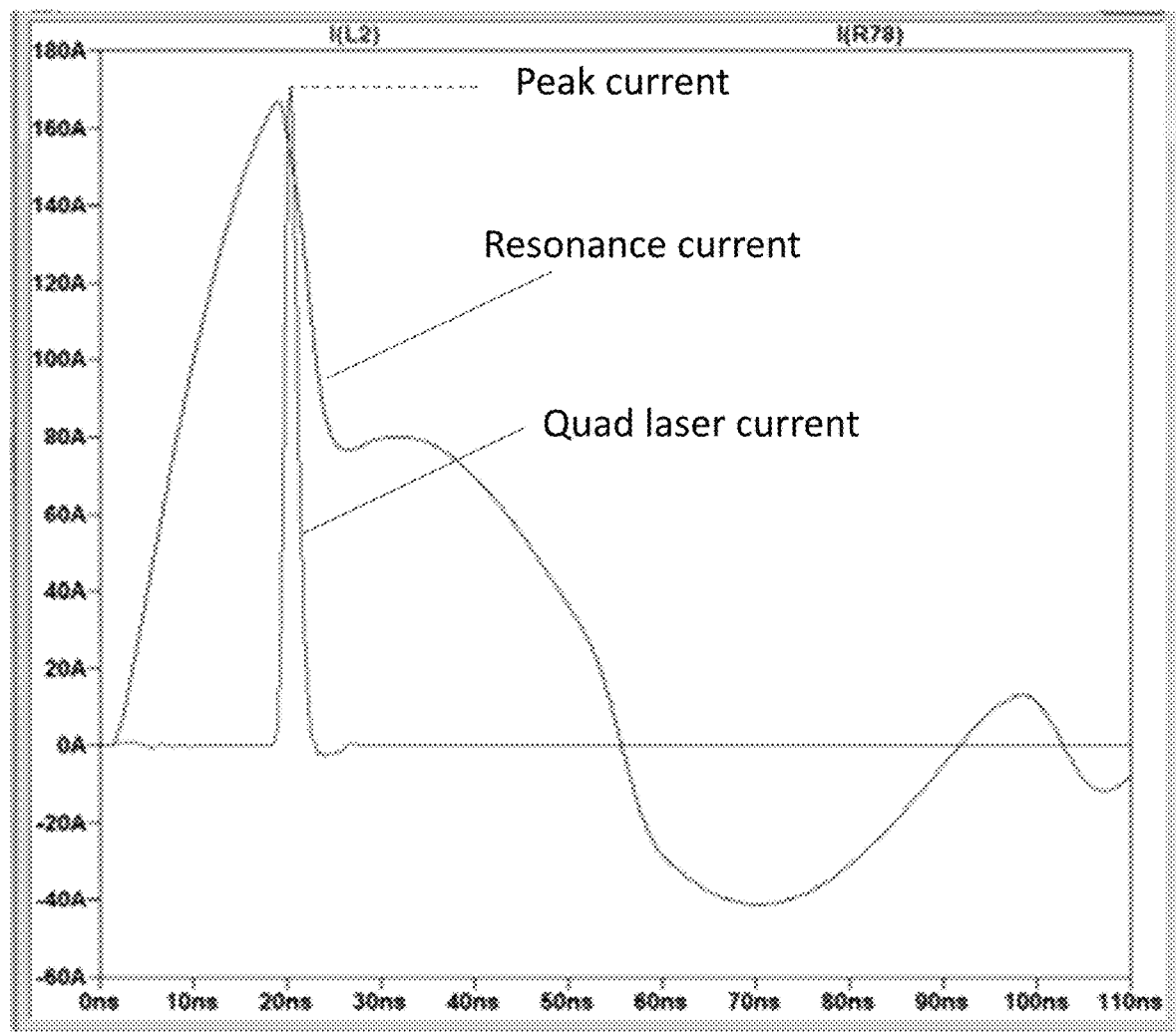

In conventional laser diode driver circuits, turn-on of a driver transistor is used to inject current to fire the laser. FIG. 7 shows an example of a quad laser array driven by a resonant driver comprising using two GaN FETs, Q1 and Q2, and LC components of a resonant driver circuit. For simplicity, the LC components of the resonant drive circuit are not shown in FIG. 7. In this laser driver, turn-off of Q2 is used to fire the laser array. That is, for operation, when both high-side and low-side GaN transistors Qland Q2 are turned on, current flows from the power supply in the LC resonant driver circuit, through both Q1 and Q2. The high side transistor Q1 is used to control charging of the resonant circuit. When the resonance current through Q1 and Q2 reaches a required value, rapid turn-off of the low side transistor Q2 directs a pulse of current through the laser array to fire the laser. For example, it has been demonstrated that this circuit is capable of achieving 170A current for simultaneous firing of a quad laser diode array, i.e. in which each laser requires 40A for peak power, with a rise time of less than 1 ns and a FWHM of 1.5 ns. For example, the circuit schematics in FIGS. 8A and 8B and the plot shown in FIG. 8C, show the resonance current, when both Q1 and Q2 are turned on, which peaks at 170A, and the quad laser diode current when low side transistor Q2 is turned-off. This circuit eliminates turn-on of the driver FET and instead uses fast turn-off for fast, high current switching.

Figure 9:
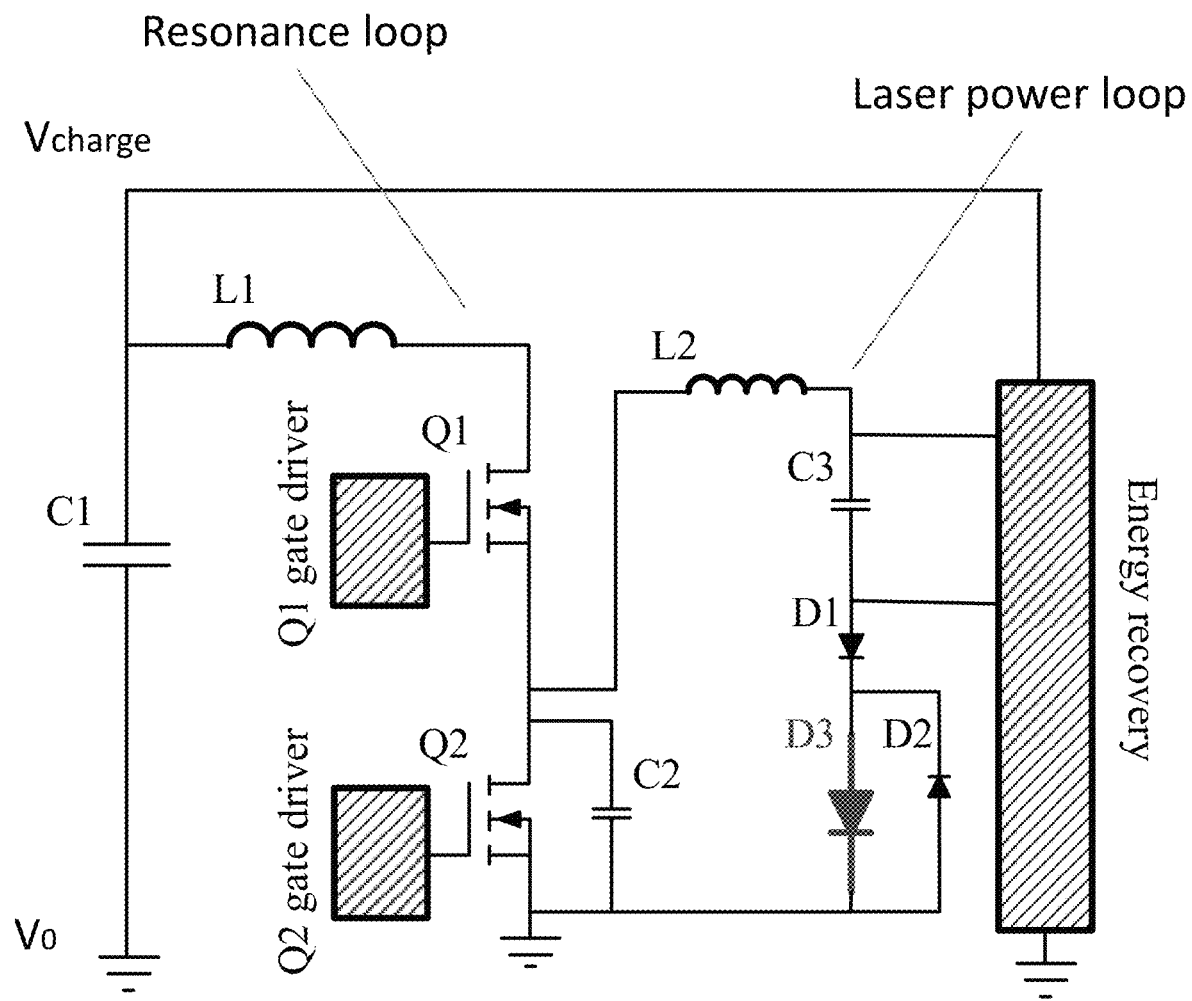
FIG. 9 shows a circuit schematic with more details of implementation of the resonant driver circuit of FIG. 7.

FIG. 9 shows more details of implementation of a resonant drive circuit of an embodiment for driving a quad laser diode array D3, and comprising first and second (high-side and low-side) switching transistors Q1 and Q2. For fast switching of high currents, Q1 and Q2 are GaN FETs, e.g. GS66516, with respective gate drivers Driver1 and Driver2. For faster turn-off, the driver circuits are operated with both positive and negative power supplies V+ and V−, e.g. +6V and −6V. That is, application of Vgs of e.g. −5V or −6V to Q2 ensures rapid and full turn-off of the low-side drive transistor Q2, which directs the current pulse to fire the laser array. Compared to the direct drive circuitry described herein, this resonant circuit driver is capable of operation with a higher duty cycle, since the pair of driver transistors Q1 and Q2 work together for fast charging and to dissipate and recover energy during the time that the laser diode array is off. In this example, Q1 and Q2 are e-mode (normally-off) transistors. Since turn-off of Q2 fires the laser, Q2 is on most of the cycle, i.e. between pulses. Q2 could be a normally-on transistor (d-mode). Q1 is normally-off and its operation is used to initiate operation and control charging of the resonant circuit, which comprises a resonance DC capacitor C1, and resonance inductor L1. C1 and L1 resonate to build up current in this loop. Then, when Q2 is turned-off, the voltage at C1 is applied to direct a pulse of current through the laser diode array D3 to generate a laser pulse. C2 is a parasitic capacitance of driver transistor Q2; ideally C2 is close to zero, but C2 may also be selected to adjust parameters of the LC resonant circuit loop. C2 and L2 control the peak voltage of Q2. C2 can be an added capacitor if the parasitic capacitance of Q2 is not sufficient, e.g. if needed for damping. Also shown are series resonance inductor L2 and series resonance capacitor C3 in the laser current drive loop. L2 represents inherent or parasitic inductances of the laser current drive loop. For faster switching, to reduce inductance of the current drive loop, this path is preferably made short, so that L2 is kept low, e.g. ~1 nH. Series resonance capacitor C3 acts a protection device and decreases the fall time of the pulse, i.e. makes it sharper. D1 is a series diode which is added so that when C3 is charged, D1 blocks the reverse current path from the laser diode array, and energy stored in C3 is sent back to the resonance capacitor C1, through an energy recovery circuit. An energy recovery circuit in parallel with C3 may be provided to send energy back to C1. Energy in L1 is sent to C1 during the resonance. C3 makes the pulse sharper and stores energy, which later can be retrieved by the energy recovery circuit. D1 is a DC blocking diode and the anti-parallel diode D2 is provided to limit the reverse voltage across the laser diode array D3 at the end of the pulse and during recovery. D1 and D2 work together to protect the laser diode array and reduce ringing.

Circuit parameters are selected, for example, so that when both Q1 and Q2 are on, the circuit resonates with a period of e.g. 20 ns to 100 ns. When the resonance current peaks, Q2 is turned-off for a required duration, e.g. for 4 ns, to generate the current pulse to fire the laser. When Q2 is turned back on, the energy recovery circuit, with L1 as a current source for recovery, returns about 70% of the stored energy back to C1. Q1 is turned off at the end of the cycle. The charging voltage is 200V, for example, to provide a required peak resonance current of 170 A. The circuit may be tunable for multiple resonances e.g. in the range of 10 MHz to 50 MHz.

Figure 10:
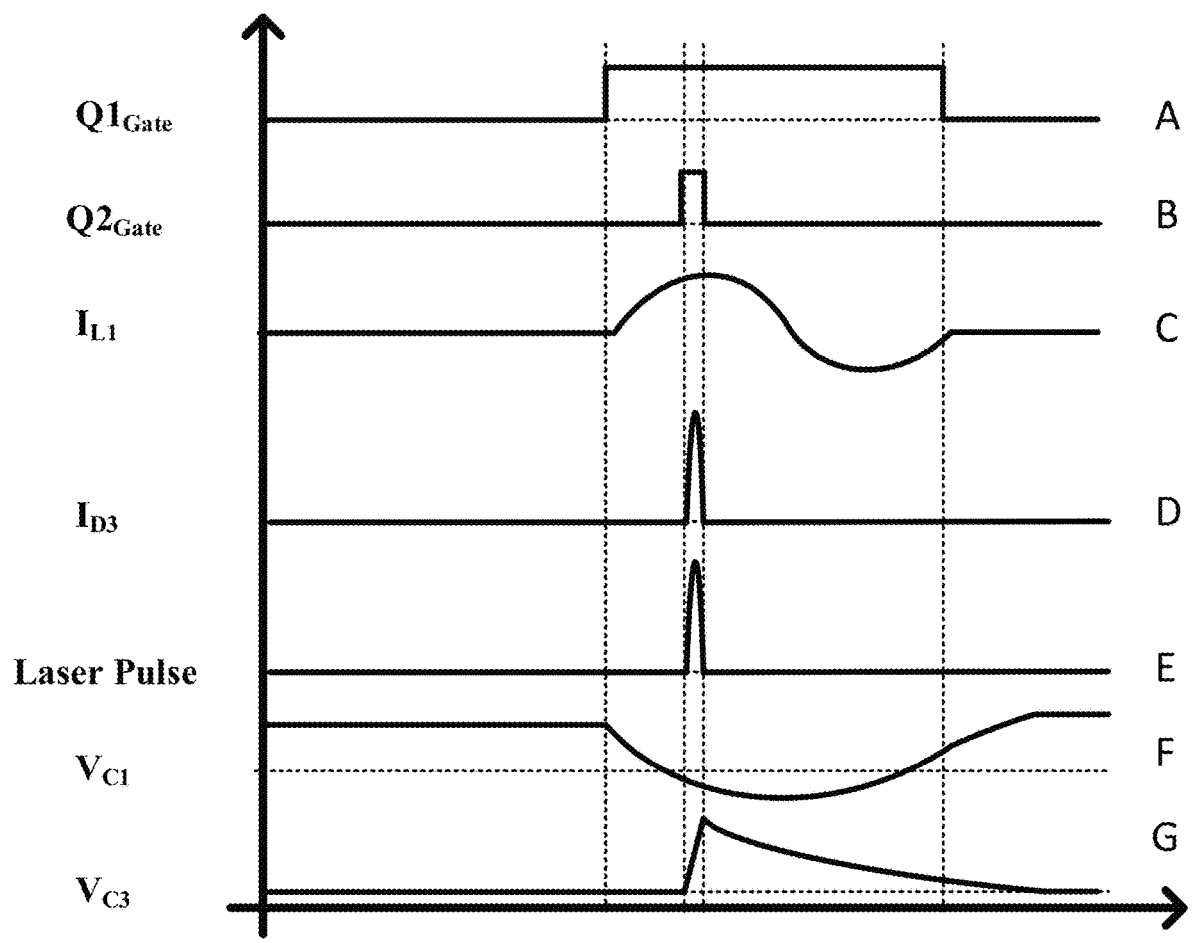
FIG. 10 shows a set of waveforms A to G to illustrate operation of the resonant driver circuit of FIG. 9, for driving a quad pulsed laser diode array.

FIG. 10 shows some examples of typical waveforms for operation of the circuit of FIG. 9. Trace A shows Vgs of Q1 which, for operation is turned on e.g. for 50 ns. Trace C shows the current $I_{L1}$ through resonance inductor L1, and trace F shows the voltage $V_{C1}$ drop and recovery for the resonance capacitor C1. Trace B shows Vgs for Q2 as it is turned on for a period of e.g. 4 ns, to fire the laser. Trace G shows the voltage across C3 before and after firing of the laser, including the energy retrieval phase. Trace D shows the laser current.

As illustrated in the schematic circuit diagram of FIG. 9, the series capacitor C3 can be positioned in the laser power loop at any suitable point, e.g. as shown in FIG. 10 instead of as shown in FIG. 9. Other series elements may be alternatively positioned as appropriate to provide the required functionality of the resonance loop and laser power loop. An energy recovery circuit element is connected to C3 to enable energy recovery to C1.

Thus, it is demonstrated that the resonance drive circuit provides for fast switching to provide for high power fast laser pulses with nanosecond rise time and nanosecond FWHM. This driver circuit can control the number of pulses in each shot to enable pulse code modulation. The series diode protects the laser diode array from reverse voltage. There is no external inductance in the laser power loop, and the layout of laser power loop is preferably configured for minimal inductance, e.g. short path length low inductance interconnect, for faster switching and a sharper (narrower FWHM) current pulse. The parasitic capacitance C2 of Q2 in the resonance circuit is used to limit the switch peak voltage. The resonance circuit and power loop are configured for fast recharging including retrieval of the resonance energy stored in L1 and C3, after the laser pulse. Energy recovery also assists in maintaining a lower operating temperature of the laser diode array, since this excess energy does not need to be dumped or dissipated through the laser diode after firing. Faster recharging also enables rapid firing of multiple pulses, e.g. for increased discrimination for fast moving targets. Multiple pulses in one shot may also be used for applications requiring pulse code modulation, i.e. generating a series or pattern of pulses uniquely identifying the emitter, for scenarios where there may be interference from other nearby emitters using the same wavelength.

The design of the system provides that GaN transistors Q1 and Q2 turn-on and turn-off under soft switching conditions (i.e. under low power loss conditions) to reduce the system total losses and lower EMI (electro-magnetic interference).

In the embodiment of the laser driver for resonant drive described above, both Q1 and Q2 are fast, high current GaN transistors. While it is important that the low-side transistor Q2 can provide fast turn-off, e.g. nanosecond or sub-nanosecond, in other embodiments, not illustrated, it is not necessary that Q1 is a GaN transistor. For example, in alternative embodiments, Q2 is a GaN transistor, and Q1 is a slower Si MOSFET or SiC transistor.

While a pulsed laser drivers of exemplary embodiments have been described in detail for nanosecond fast pulses, it will be appreciated that in alternative embodiments, circuit parameters may be selected to provide pulsed laser drivers for pulse widths in a range of sub-nanosecond to tens of nanoseconds for high peak current (e.g. ≥100 A), high power laser diode applications. For lower power laser diode arrays, a pulsed laser driver of an embodiment that provides tens of amp may be sufficient to provide a peak power of e.g. >100 W. For example, for a laser driver providing a peak current of 60 A could drive four laser diode channels with 13 A each, for e.g. a peak power of 40 W per channel for a total of 160 W peak power.

While several embodiments have been described in detail, by way of example, the laser drivers of embodiments described herein may be implemented as circuits comprising discrete elements, as modules in which components are at least partially integrated as one or more functional block. In some embodiments, components of the driver circuitry may be provided as integrated circuit modules that combine the main current switch Qmain and driver circuitry on one substrate. For example, the latter may be integrated into a module which is directly connected by low inductance interconnect to a surface mount laser diode or laser diode array.

The use of fast, high current GaN power transistors as current switching devices in either direct drive or resonance drive pulsed laser drivers offers significant performance enhancements, e.g. potentially an order of magnitude combined improvement in power and speed, relative to conventional Si or SiC laser drivers. For applications requiring either lower power or lower speed, the circuit topologies disclosed herein using GaN FETS for the pulsed laser driver for direct drive with driver assist circuitry, and the pulsed laser driver with resonance drive, may alternatively be implemented with Si power MOSFETS or SiC power MOSFETs, instead of one or more of the GaN power transistors. For example, as mentioned above, the resonance driver circuitry may be implemented using a fast, high current GaN transistor for Q2, and Si or SiC technology for Q1. Also, for example, in other embodiments the driver assist circuitry may be configured for driving a SiC power MOSFET or a Si power MOSFET.

LIDAR Applications

The use of laser drivers comprising GaN power transistors for fast, high current switching provides for operation at the elevated current levels and nanosecond or sub-nanosecond rise times necessary for long-distance LiDAR requires the high power, high frequency and robust thermal performance.

The high current, ultrafast laser driver disclosed herein can be configured to drive high-power, laser diodes, such as Osram SPL DS90A_3, to 120 W at 40 A. A multi-channel Surface Mount (SMT) laser array, e.g. a quad laser array of multiple laser diodes connected in parallel, for LiDAR systems enables longer range and higher resolution LiDAR architectures. The additional channels increase the field of view and total peak power, with each channel being capable of generating 120 W. The ability to transmit short pulses with a nanosecond rise time, while maintaining high peak power, e.g. driving all four channels at 40 A each to deliver 480 W peak power, provides for longer range and higher resolution. This peak power can be modulated at low-duty cycles to produce high resolution 3D cloud points at long range for new LIDAR designs. For example, Scanning LiDAR is a key technology for Advanced Driver-Assistance Systems (ADAS), which is designed to increase road safety and enable autonomous driving. These electronic devices react instantly to potential collisions without wasting precious seconds of reaction time. Scanning LiDAR creates high-resolution 3D images of a car's surroundings and registers obstacles early enough for ADAS or self-driving cars to initiate the appropriate driving maneuvers, such as automatic braking to prevent collisions.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A circuit for driving a laser component, the circuit configured to operate in a charging phase in which the laser component does not emit a laser, and a laser emissions phase in which the laser component does emit a laser, the circuit comprising:
    an inductor;
    a capacitor having a first terminal connected to a power source;

a first transistor and a second transistor connected in series between the inductor and a reference voltage source, the first transistor having a gate that controls whether current flows from a drain to a source of the first transistor, the drain of the first transistor connected via the inductor to a first terminal of the capacitor, the source of the first transistor electrically coupled to the laser component, the second transistor having a gate that controls whether current flows from a drain to a source of the second transistor, the drain of the second transistor directly connected to the source of the first transistor, the source of the second transistor connected to the reference voltage source;

a first gate driver connected to the gate of the first transistor to control whether the first transistor is on or off, the first gate driver configured to keep the first transistor on during both the charging phase and the laser emissions phase;

a second gate driver connected to the gate of the second transistor to control whether the second transistor is on or off, the second gate driver configured to keep the second transistor on during the charging phase, but turn the second transistor off during the laser emissions phase, the circuit being configured such that:
in the charging phase, charge is provided to the first terminal of the capacitor and current flows through the inductor, the first transistor, the second transistor, and into the reference voltage source;
in the laser emissions phase, current flows through the inductor, the first transistor and instead of passing through the second transistor, is diverted to the laser component, to thereby provide a current pulse to the laser component.

2. The circuit according to claim 1, a second terminal of the capacitor also being connected to the reference voltage source.

3. The circuit according to claim 1, the reference voltage being ground.

4. The circuit according to claim 1, the laser component comprising a quad laser diode array.

5. The circuit according to claim 1, the laser component being within a current path that extends from the source of the first transistor to the reference voltage source, the current path being a path through which current is diverted when the second gate driver turns the second transistor off during the laser emissions phase.

6. The circuit according to claim 5, the capacitor being a first capacitor, the circuit further comprising a second capacitor and a diode connected in the current path between the source of the first transistor and the laser component, such that the second capacitor is connected between the source of the first transistor and an anode of the diode.

7. The circuit according to claim 6, the circuit further comprising an energy recovery component connected between the second capacitor and the first capacitor, the recovery component configured to, during the charging phase, provide charge from the second capacity to the first capacitor.

8. The circuit according to claim 6, the diode being a first diode, the laser component comprising:
a second diode being a laser diode having an anode connected to a cathode of the first diode, the laser diode having a cathode connected to the reference voltage source.

9. The circuit according to claim 8, the circuit further comprising a third diode having an anode connected to the cathode of the laser diode, the third diode having a cathode connected to the anode of the laser diode.

10. The circuit according to claim 8, the laser diode being a quad laser diode array.

11. The circuit according to claim 1, the circuit being configured to generate current pulses to the laser component with a rise-time in a sub-nanosecond to nanosecond range, a pulse duration in a range of a sub-nanosecond to tens of nanoseconds, and a peak current to the laser component in a range of tens of amps to $\geq$100 A.

12. The circuit according to claim 1, the circuit being configured to generate current pulses to the laser component with a rise-time in a sub-nanosecond to nanosecond range, a pulse duration in a range of a sub-nanosecond to tens of nanoseconds, and a peak current of $\geq$100 A.

13. The circuit according to claim 1, the circuit being configured to generate current pulses to the laser component with a nanosecond rise time, a nanosecond pulse duration and a peak current of 170 A.

14. The circuit according to claim 9, the laser component comprising a quad laser diode array.

15. A method for operating a circuit for driving a laser component, the circuit configured to operate in a charging phase in which the laser component does not emit a laser, and a laser emissions phase in which the laser component does emit a laser, the circuit comprising an inductor; a capacitor having a first terminal connected to a power source; a first transistor and a second transistor connected in series between the inductor and a reference voltage source, the first transistor, a drain of the first transistor being connected via the inductor to a first terminal of the capacitor, the source of the first transistor being electrically coupled to the laser component, the drain of the second transistor directly connected to the source of the first transistor, the source of the second transistor connected to the reference voltage source; the method comprising:
in the charging phase, providing charge to the first terminal of the capacitor by turning on the first transistor and turning on the second transistor such that current flows in series through the inductor, the first transistor, the second transistor, and into the reference voltage source; and
in the laser emissions phase, keeping on the first transistor, but turning off the second transistor, such that current flows through the inductor, the first transistor, and is diverted to the laser component, thereby providing a current pulse to the laser component.

\* \* \* \* \*